(12) United States Patent
Yang

(10) Patent No.: US 10,903,144 B1
(45) Date of Patent: Jan. 26, 2021

(54) SEMICONDUCTOR PACKAGE AND MANUFACTURING METHOD THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/792,284

(22) Filed: Feb. 16, 2020

(51) Int. Cl.
  *H01L 23/482* (2006.01)
  *H01L 23/528* (2006.01)
  *H01L 23/552* (2006.01)
  *H01L 23/60* (2006.01)

(52) U.S. Cl.
  CPC ...... *H01L 23/4824* (2013.01); *H01L 23/5286* (2013.01); *H01L 23/552* (2013.01); *H01L 23/60* (2013.01)

(58) Field of Classification Search
  CPC ............. H01L 23/4824; H01L 23/5286; H01L 23/552; H01L 23/60
  See application file for complete search history.

(56) References Cited

U.S. PATENT DOCUMENTS

| | | | |
|---|---|---|---|
| 2008/0296570 A1* | 12/2008 | Chen | H01L 23/585 257/48 |
| 2015/0371941 A1* | 12/2015 | Nakaiso | H01L 23/528 257/499 |
| 2016/0225889 A1* | 8/2016 | Umeno | H01L 29/2003 |

* cited by examiner

*Primary Examiner* — Peniel M Gumedzoe
(74) *Attorney, Agent, or Firm* — CKC & Partners Co., LLC

(57) ABSTRACT

A semiconductor package includes a substrate and a semiconductor chip disposed thereon. The substrate includes first and second connection pads adjacent to a first edge of the semiconductor chip, and third and fourth connection pads adjacent to a second edge opposite to the first edge. The semiconductor chip includes fifth and sixth connection pads in a first region close to the first edge, and seventh and eighth connection pads in a second region close to the second edge. A first and a second comb-type conductive layer are further disposed over the first region, and respectively connected to the first and fifth connection pads, and the second and sixth connection pads via wirings. A third and a fourth comb-type conductive layer are further disposed over the second region, and respectively connected to the fourth and eighth connection pads, and the third and seventh connection pads via wirings.

15 Claims, 7 Drawing Sheets

SEMICONDUCTOR PACKAGE AND MANUFACTURING METHOD THEREOF

BACKGROUND

Field of Invention

The present invention relates to a semiconductor package and manufacturing method thereof.

Description of Related Art

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor devices. Numerous manufacturing steps are undertaken in the production of such semiconductor packages.

However, the manufacturing of semiconductor devices in a miniaturized scale is becoming more complicated. For example, the integration of large numbers of tiny MOS transistors into a small chip results in circuits that are orders of magnitude smaller, faster, and less expensive than those constructed of discrete electronic components. However, with the requirement of smaller and faster components in a chip, the current requirement is increasing as well. Undesired signal distortion and power supply voltage drop (i.e., IR drop) are caused while tiny metal wires of the chip transfer the signal with large electrical current, and noise problem is also caused in ground connection or power connection of the chip.

SUMMARY

In accordance with an aspect of the present disclosure, a semiconductor package is provided. The semiconductor package includes a substrate, a semiconductor chip, comb-type conductive layers and wirings. The substrate includes a plurality of first connection pads and a plurality of second connection pads adjacent to a first edge of the substrate, and a plurality of third connection pads and a plurality of fourth connection pads adjacent to a second edge of the substrate, wherein the second edge is opposite to the first edge. The semiconductor chip disposed on the substrate includes a first region and a second region respectively adjacent to the first edge and the second edge. A plurality of fifth connection pads and a plurality of sixth connection pads are disposed in the first region, and a plurality of seventh connection pads and a plurality of eighth connection pads are disposed in the second region. A first comb-type conductive layer and a second comb-type conductive layer are disposed over the first region, and a third comb-type conductive layer and a fourth comb-type conductive layer are disposed over the second region. A plurality of first wirings and fifth wirings are respectively connected to the first connection pads and the fifth connection pads with the first comb-type conductive layer. A plurality of second wirings and sixth wirings are respectively connected to the second connection pads and the sixth connection pads with the second comb-type conductive layer. A plurality of third wirings and seventh wirings are respectively connected to the third connection pads and the seventh connection pads with the fourth comb-type conductive layer. A plurality of fourth wirings and eighth wirings are respectively connected to the fourth connection pads and the eight connection pads with the third comb-type conductive layer.

According to some embodiments of the present disclosure, the first comb-type conductive layer and the second comb-type conductive layer are interdigitated with each other, and the third comb-type conductive layer and the fourth comb-type conductive layer are interdigitated with each other.

According to some embodiments of the present disclosure, each of the first, the second, the third, and the fourth comb-type conductive layers includes: a base portion extending along a first direction, and a plurality of protruding portions extending along a second direction from the base portion, wherein the second direction is different from the first direction.

According to some embodiments of the present disclosure, the first connection pads are connected to a power supply, and the fifth connection pads are power-supply connection pads of the semiconductor chip.

According to some embodiments of the present disclosure, the second connection pads are grounded, and the sixth connection pads are ground voltage connection pads of the semiconductor chip.

According to some embodiments of the present disclosure, the third connection pads are grounded, and the seventh connection pads are ground voltage connection pads of the semiconductor chip.

According to some embodiments of the present disclosure, the fourth connection pads are connected to a power supply, and the eighth connection pads are power-supply connection pads of the semiconductor chip.

According to some embodiments of the present disclosure, the first region and the second region are at two opposite sides of a central line, the fifth connection pads and the sixth connection pads are arranged along the central line in the first region, and the seventh connection pads and the eighth connection pads are arranged along the central line in the second region.

According to some embodiments of the present disclosure, the semiconductor package further includes an adhesive layer disposed between the semiconductor chip and the first, the second, the third and the fourth comb-type conductive layers.

In accordance with an aspect of the present disclosure, a method of manufacturing a semiconductor package is provided. The method includes providing a substrate including a plurality of first connection pads and a plurality of second connection pads adjacent to a first edge of the substrate, and a plurality of third connection pads and a plurality of fourth connection pads adjacent to a second edge of the substrate, wherein the second edge is opposite to the first edge; placing a semiconductor chip on the substrate, wherein the semiconductor chip includes a plurality of fifth connection pads and a plurality of sixth connection pads arranging along a first direction, and a plurality of seventh connection pads and a plurality of eighth connection pads arranging along the first direction and adjacent to the fifth connection pads and sixth connection pads; placing a first comb-type conductive layer, a second comb-type conductive layer, a third comb-type conductive layer, and a fourth comb-type conductive layer on the semiconductor chip, wherein the first and the second comb-type conductive layers are close to the first edge, and the third and the fourth comb-type conductive layers are close to the second edge; forming a plurality of first wirings and fifth wirings connecting the first connection pads and the fifth connection pads with the first comb-type conductive layer; forming a plurality of second wirings and sixth wirings connecting the second connection pads and the sixth connection pads with the second comb-type conductive layer; forming a plurality of third wirings and seventh wirings connecting the third connection pads and the seventh connection pads with the fourth comb-type conductive layer; and forming a plurality of fourth wirings and eighth wirings connecting the fourth connection pads and the eighth connection pads with the third comb-type conductive layer.

According to some embodiments of the present disclosure, the first comb-type conductive layer are interdigitated with the second comb-type conductive layer, and the third comb-type conductive layer are interdigitated with the fourth comb-type conductive layer.

According to some embodiments of the present disclosure, the first connection pads are connected to a power supply, and the fifth connection pads are power-supply connection pads of the semiconductor chip; and the second connection pads are grounded, and the sixth connection pads are grounded voltage connection pads of the semiconductor chip.

According to some embodiments of the present disclosure, the third connection pads are grounded, and the seventh connection pads are grounded voltage connection pads of the semiconductor chip; and the fourth connection pads are connected to a power supply, and the eighth connection pads are power-supply connection pads of the semiconductor chip.

According to some embodiments of the present disclosure, the semiconductor chip has a first region and a second region adjacent to the first region, the fifth connection pads and the sixth connection pads are disposed in the first region, and the seventh connection pads and the eighth connection pads are disposed in the second region.

According to some embodiments of the present disclosure, the first, the second, the third, and the fourth comb-type conductive layers are attached to the semiconductor chip via an adhesive layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
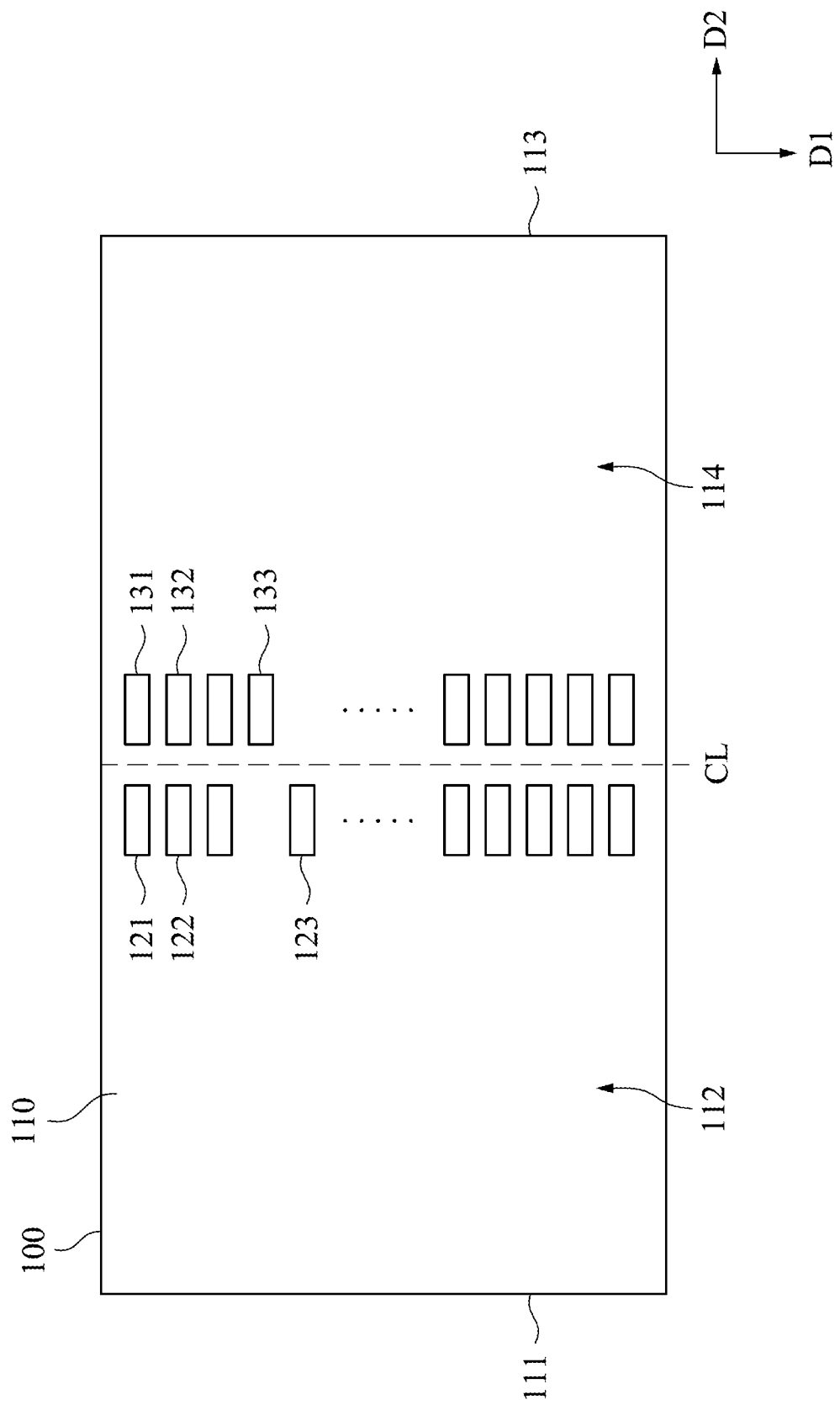
FIG. 1 is a top view of various intermediary stages in the manufacturing of semiconductor package in accordance with some embodiments of this disclosure.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

A method for manufacturing a semiconductor package is described below, in accordance with some embodiments of the disclosure.

Referring to FIG. 1, the preparation of the semiconductor package begins with providing a semiconductor chip 100. The semiconductor chip 100 may include a semiconductor substrate made of semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

The semiconductor chip 100 may also include an electronic layer. The electronic layer may include a number of microelectronic elements. Examples of the microelectronic elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form an integrated circuit, such as a logic device, memory device (e.g., SRAM), RF device, input/output (I/O) device, system-on-chip (SOC) device, system-in-chip (SIC) device, Dynamic random-access memory (DRAM), combinations thereof, and other suitable types of devices.

As shown in FIG. 1, the semiconductor chip 100 includes two rows of connection pads. For example, a plurality of connection pads 121, 122, 131 and 132 are formed on a top surface 110 of the semiconductor chip 100. The connection pads 121 and 122 may be arranged along a first direction D1, and the connection pads 131 and 132 are also arranged along the first direction D1 and respectively adjacent to the connection pads 121 and connection pads 122. In some embodiments, the top surface 110 of the semiconductor chip 100 is divided into a first region 112 and a second region 114 adjacent to the first region 112. The first region 112 and the second region 114 are located at two opposite sides of a central line CL. The first region 112 extends from the central line CL to a first edge 111 of the semiconductor chip 100, and the second region 114 extends from the central line CL to a second edge 113 of the semiconductor chip 100. The connection pads 121 and 122 are disposed in the first region 112, and the connection pads 131 and 132 are disposed in the second region 114. In some embodiments, the connection pads 121, 122, 131, and 132 are electrically connected to the microelectronic elements in the semiconductor chip 100. Specifically, the connection pads 121 and 122 may be aligned along a central line CL in the first region 112, and the connection pads 131 and 132 may be aligned along a central line CL in the second region 114.

The connection pads 121, 122, 131, and 132 represent any of the various terminals commonly formed near the surface of a semiconductor die through which electrical connections are made between integrated circuit in the die and external circuits. For example, the connection pad 121 may be a power-supply connection pad (also referred to as fifth connection pad), and the connection pad 122 may be a ground voltage connection pad (also referred to as sixth connection pad). For example, the connection pad 131 may be a ground voltage connection pad (also referred to as seventh connection pad), and the connection pad 132 may be a power-supply connection pad (also referred to as eighth connection pad). In some embodiments, the semiconductor chip 100 includes a plurality of power-supply connection pads and a number of ground voltage connection pads; however, for the purpose of clarity the other connection pads are not designated with reference numerals.

In some embodiments, the semiconductor chip 100 further includes a plurality of signal pads 123 and 133. As shown in FIG. 1, the signal pads 123 may be disposed in the first region 112 and aligned with the fifth connection pads 121 and the sixth connection pads 122, and the signal pads 133 may be disposed in the second region 114 and aligned with the seventh connection pads 131 and the eighth connection pads 132. For the purpose of clarity the other signal pads are not designated with reference numerals.

Figure 2:
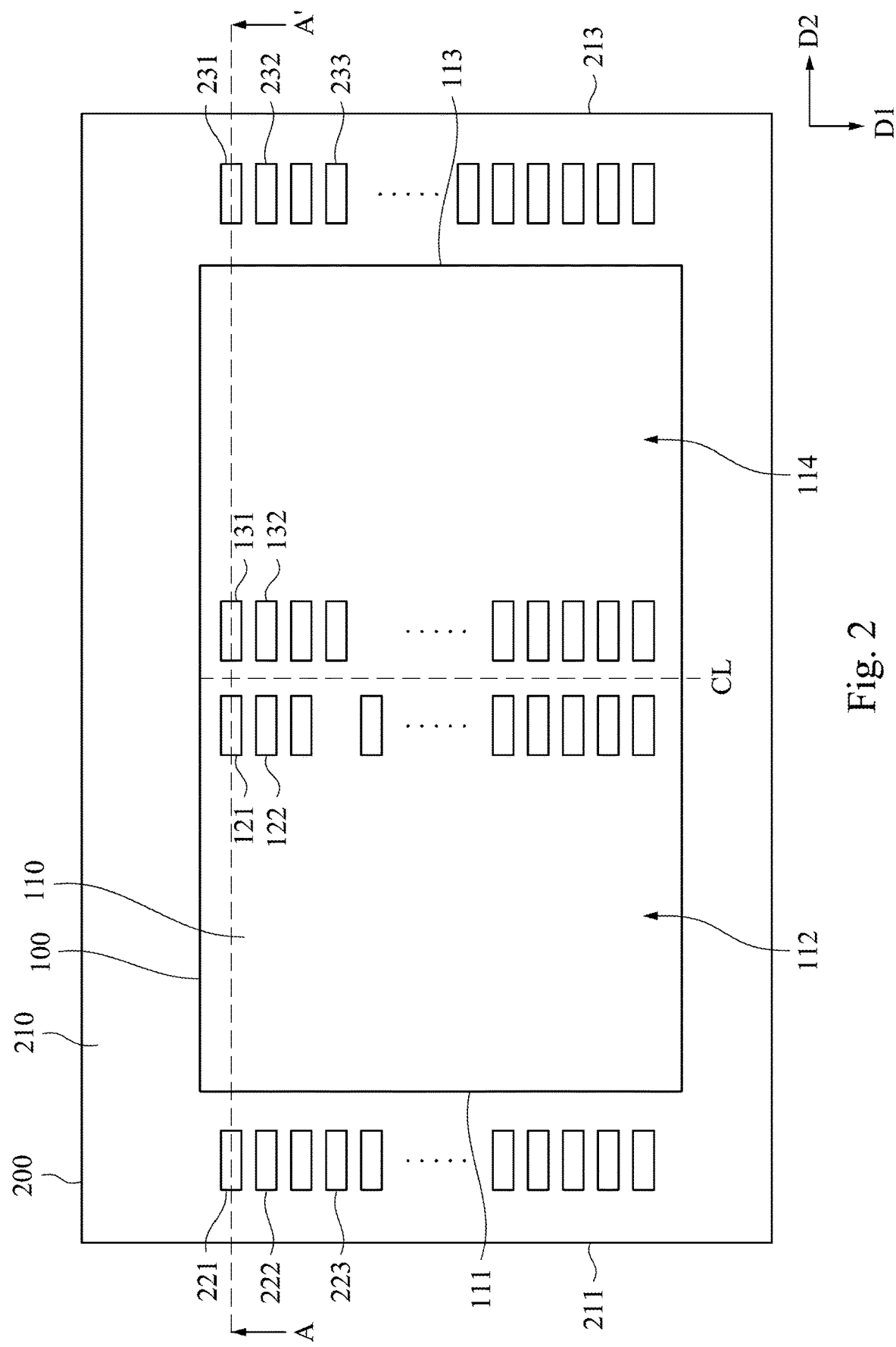
FIG. 2 is a top view of various intermediary stages in the manufacturing of semiconductor package in accordance with some embodiments of this disclosure.
Figure 3:
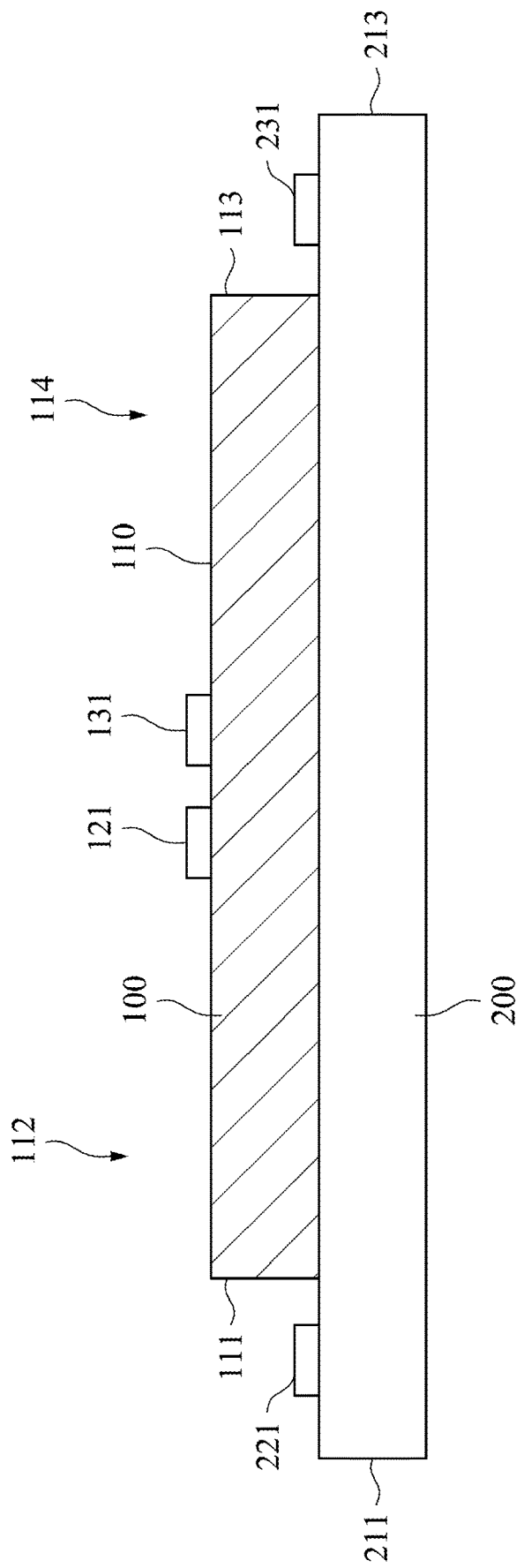
FIG. 3 shows a cross-sectional view taken along a line A-A' of FIG. 2.

Referring to FIG. 2 and FIG. 3, the preparation of the semiconductor package further includes placing the semiconductor chip 100 on a substrate 200. Specifically, the semiconductor chip 100 is placed on a top surface 210 of the substrate 200. In some embodiments, the substrate 200 may be a printed-circuit board, a ceramic, an organic, glass, and/or semiconductor material or structure, which provides a backplane with power, ground, control, monitoring, etc.

As shown in FIG. 2, the substrate 200 includes a plurality of connection pads, such as connection pads 221, 222, 231 and 232, to route electrical signals to or from the semiconductor chip 100. The connection pads 221 and 222 are adjacent to a first edge 211 of the substrate 200, the connection pads 231 and 232 are adjacent to a second edge 213 of the substrate 200, and the second edge 213 is opposite to the first edge 211. Specifically, the connection pads 221 and 222 may be located between the first edge 211 of the substrate 200 and the first edge 111 of the semiconductor chip 100, and the connection pads 231 and 232 are located between the second edge 213 of the substrate 200 and the second edge 113 of the semiconductor chip 100.

In some embodiments, the connection pads 221 and 222 are respectively aligned with the connection pads 121 and 122 of the semiconductor chip 100 in a straight line that is perpendicular to the first edge 111. Similarly, the connection pads 231 and 232 are respectively aligned with the connection pads 131 and 132 of the semiconductor chip 100 in a straight line that is perpendicular to the second edge 113. For example, the connection pads 221, 121, 131 and 231 are arranged along a straight line that is perpendicular to the first edge 111. In addition, the connection pads 222, 122, 132 and 232 are arranged along another straight line that is perpendicular to the second edge 113.

In some embodiments, the connection pads that are aligned each other have a related function. For example, as shown in FIG. 2, the connection pads 221 aligned with the fifth connection pads (power-supply connection pads) 121 are connected to a power supply, and the connection pads 222 aligned with the sixth connection pads (ground voltage connection pads) 122 are grounded. Moreover, the connection pads 231 aligned with the connection pads 131 (grounded voltage connection pads) are grounded, and the connection pads 232 aligned with the connection pads 132 (power supply connection pads) are connected to a power supply. However, the electrical function of the connection pads on the substrate 200 is not limited to the above-mentioned embodiments.

For the sake of brevity, in the following description, the connection pad 221 which is connected to a power supply and next to the first edge 211 is referred to as "first connection pad", the connection pad 222 which is grounded and next to the first edge 211 is referred to as "second connection pad", the connection pad 231 which is grounded and next to the second edge 213 is referred to as "third connection pad", and the connection pad 232 which is connected to a power supply and next to the second edge 213 is referred to as "fourth connection pad".

In some embodiments, the substrate 200 further includes a plurality of signal pads 223 and 233. As shown in FIG. 2, the signal pads 223 may be aligned with the first connection pads 221 and the second connection pads 222, and the signal pads 233 may be aligned with the third connection pads 231 and the fourth connection pads 232. For the purpose of clarity the other signal pads are not designated with reference numerals.

Figure 4:
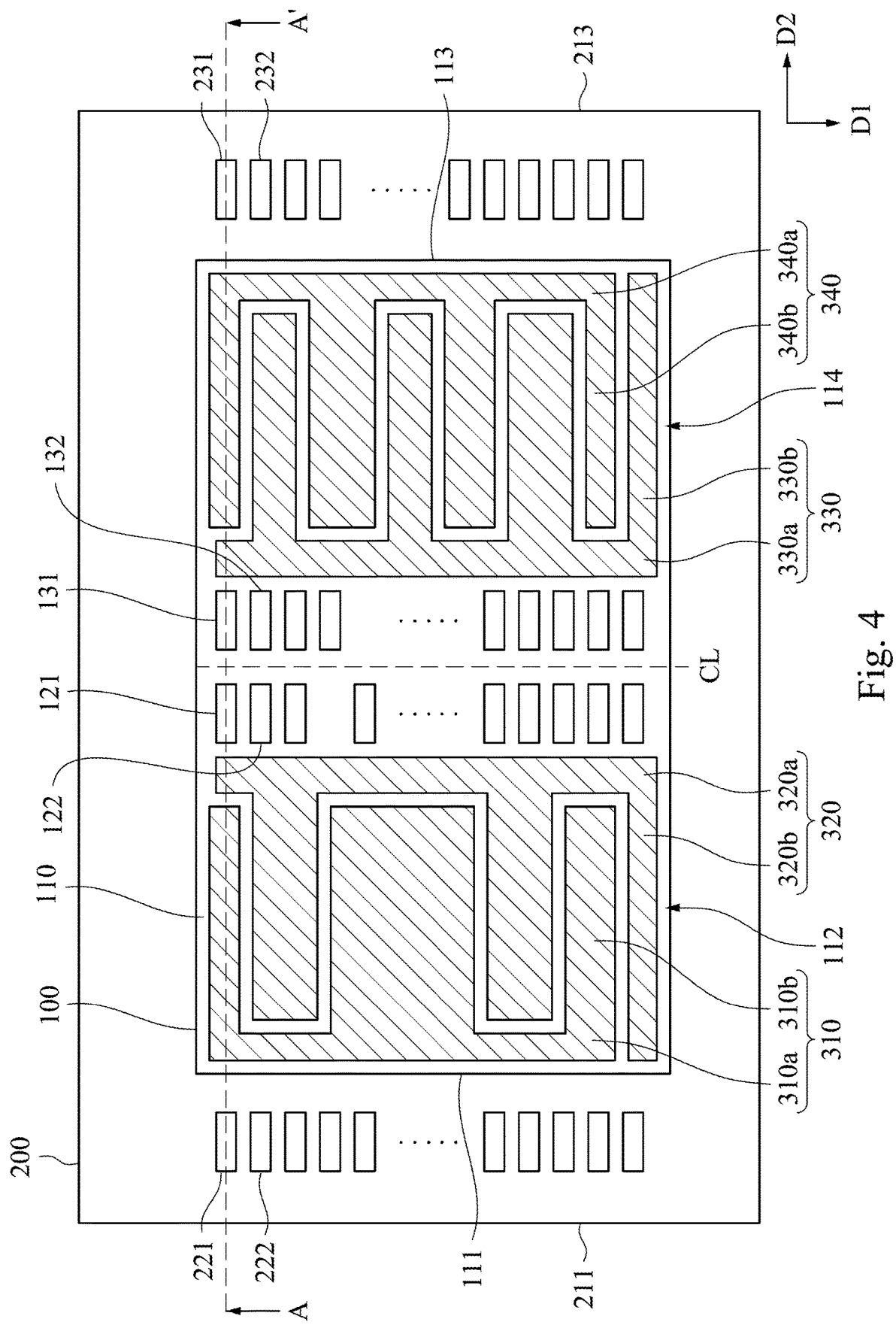
FIG. 4 is a top view of various intermediary stages in the manufacturing of semiconductor package in accordance with some embodiments of this disclosure.
Figure 5:
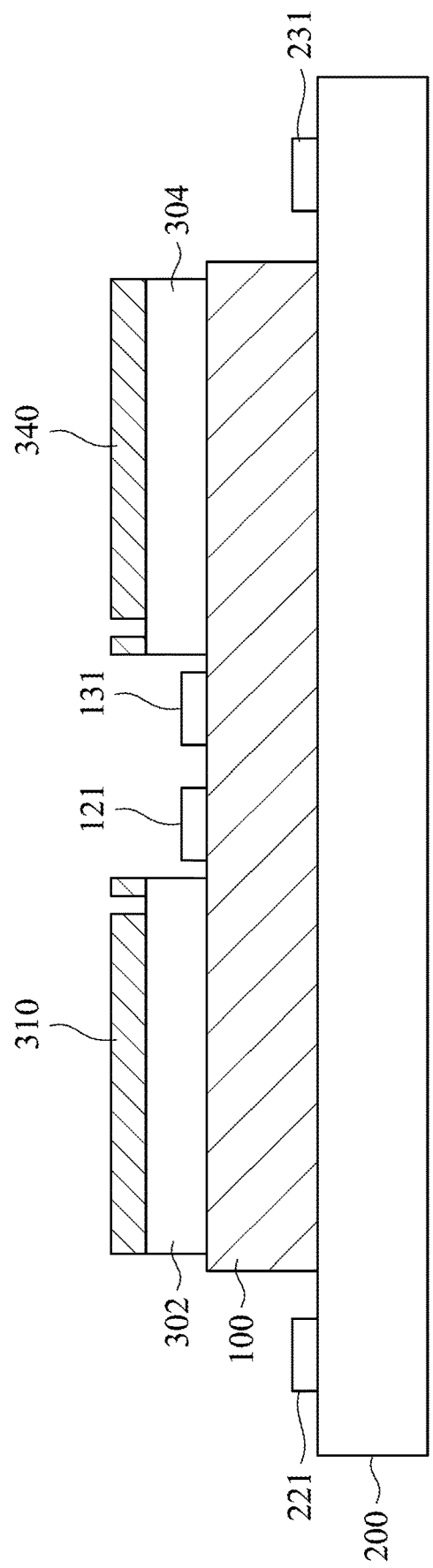
FIG. 5 shows a cross-sectional view taken along a line A-A' of FIG. 4.

Referring to FIG. 4 and FIG. 5, the preparation of the semiconductor package further includes placing a first comb-type conductive layer 310, a second comb-type conductive layer 320, a third comb-type conductive layer 330, and a fourth comb-type conductive layer 340 on the semiconductor chip 100. As shown in FIG. 4, the first comb-type conductive layer 310 and the second comb-type conductive layer 320 are disposed over the first region 112 of the top surface 110, and the third comb-type conductive layer 330 and the fourth comb-type conductive layer 340 are disposed over the second region 114 of the top surface 110.

In some embodiments, the first comb-type conductive layer 310 are interdigitated with the second comb-type conductive layer 320, and the third comb-type conductive layer 330 are interdigitated with the fourth comb-type conductive layer 340. In addition, the first comb-type conductive layer 310 and the second comb-type conductive layer 320 are separated from each other. Similarly, the third comb-type conductive layer 330 and the fourth comb-type conductive layer 340 are separated from each other.

In some embodiments, each of the first, second, third and fourth comb-type conductive layers 310, 320, 330 and 340 includes a base portion extending along the first direction D1, and a plurality of protruding portions extending along the second direction D2 from the base portion. For example, the first comb-type conductive layer 310 has a base portion 310a and a plurality of protruding portions 310b. The base portion 310a is close to the first edge 111 and extends along the first direction D1, the protruding portions 310b extend along the second direction D2 from the base portion 310a, and the second direction D2 is different from the first direction D1. The second comb-type conductive layer 320 has a base portion 320a and a plurality of protruding portions 320b. The base portion 320a is close to the fifth connection pads 121 and sixth connection pads 122 and extends along the first direction D1. The protruding portions 320b extend along the second direction D2 from the base portion 320a. Similarly, the third comb-type conductive layer 330 has a base portion 330a extending along the first direction D1 and close to the seventh connection pads 131 and eighth connection pads 132, and a plurality of protruding portions 330b extend along the second direction D2 from the base portion 330a. The fourth comb-type conductive layer 340 has a base portion 340a extending along the first direction D1 and close to the second edge 113, and a plurality of protruding portions 340b extends along the second direction D2 from the base portion 340a.

It is noted that comb-type conductive layers shown in FIG. 4 is merely an example, and is not intended to limit the present disclosure. Accordingly, it is understood that the dimension and the numbers of the protruding portions of the comb-type conductive layers may be selected depending on the needed.

In some embodiments, the material of the first comb-type conductive layer 310, the second comb-type conductive layer 320, the third comb-type conductive layer 330, and the fourth comb-type conductive layer 340 may include metal such as copper or aluminum, or any other metal possessing low resistivity.

The first, the second, the third, and the fourth comb-type conductive layers 310, 320, 330 and 340 may be formed on the semiconductor chip 100 through suitable techniques. For example, as shown in FIG. 5, the first and the second comb-type conductive layers 310 and 320 are connected to the semiconductor chip 100 via an adhesive layer 302, and the third and the fourth comb-type conductive layers 330 and 340 are connected to the semiconductor chip 100 via an adhesive layer 304. The adhesive layers 302 is disposed between first and second comb-type conductive layers 310 and 320 and the semiconductor chip 100, and the adhesive layers 304 is disposed between the third and fourth comb-type conductive layers 330 and 340 and the semiconductor chip 100. The adhesive layers 302 and 304 insulate the first, second, third and fourth comb-type conductive layers 310, 320, 330 and 340 from the semiconductor chip 100. In other words, the adhesive layers 302 and 304 include insulating material, and are added between the comb-type conductive layers and the semiconductor chip 100 in order to prevent short circuit.

In some embodiments, a top surface of the first and second comb-type conductive layers 310 and 320 are level with a top surface of the third and fourth comb-type conductive layers 330 and 340. In some embodiments, the adhesive layers 302 and 304 may be a bonding film or glue.

Figure 6:
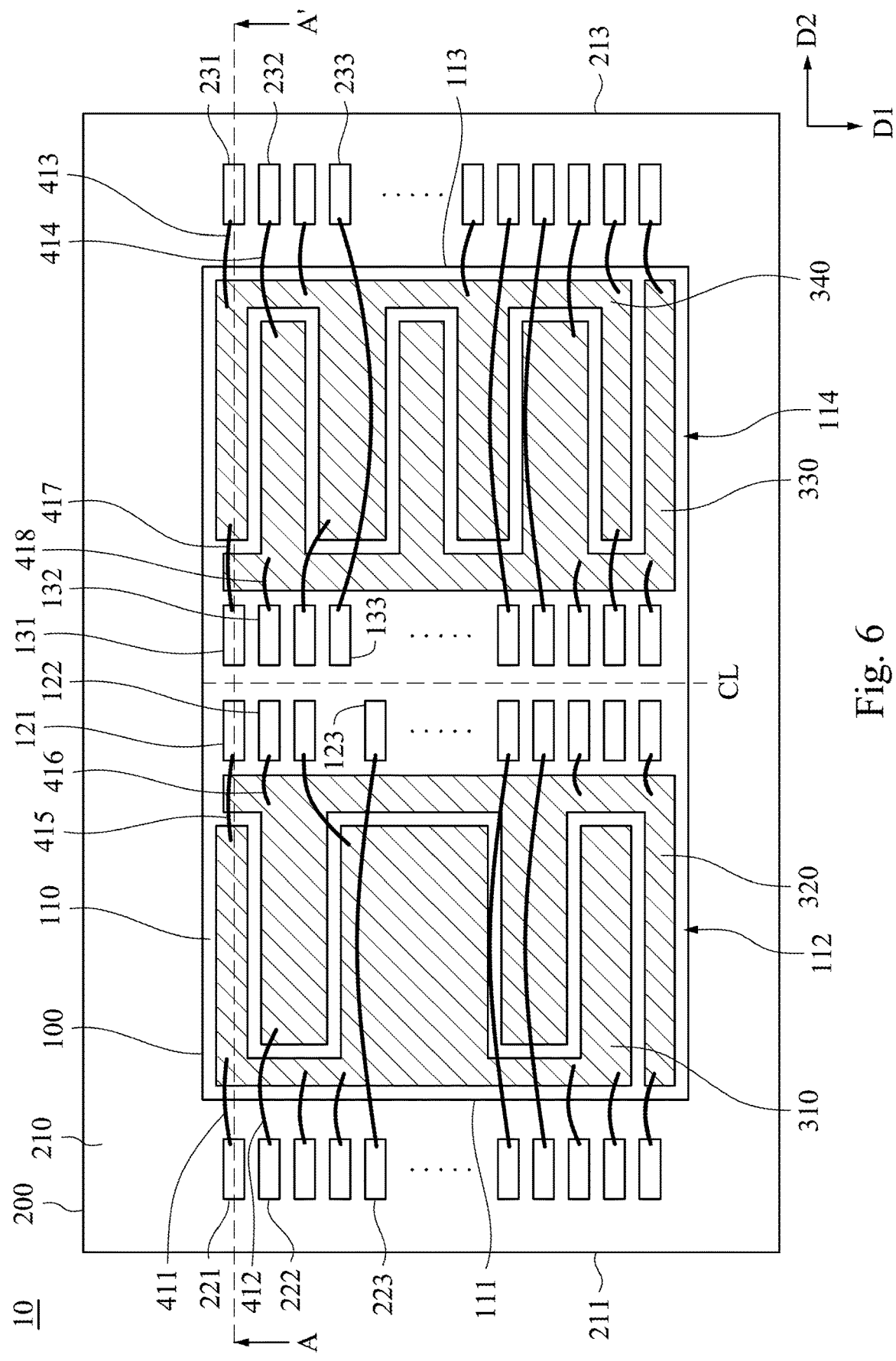
FIG. 6 is a top view of various intermediary stages in the manufacturing of semiconductor package in accordance with some embodiments of this disclosure.
Figure 7:
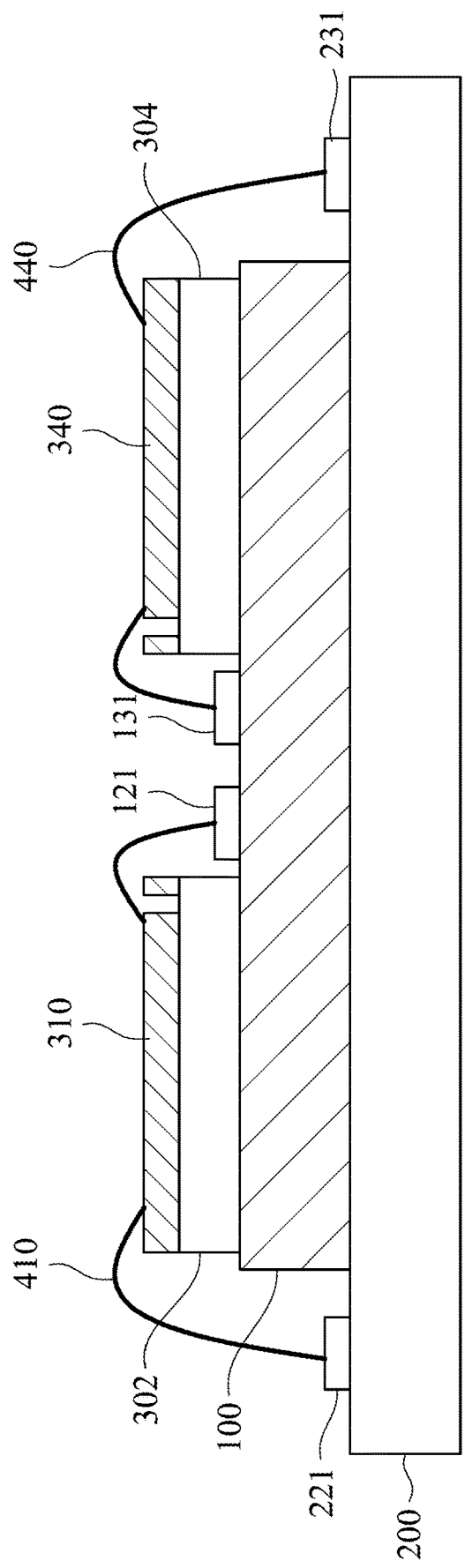
FIG. 7 shows a cross-sectional view taken along a line A-A' of FIG. 6.

Referring to FIG. 6 and FIG. 7, the preparation of the semiconductor package further includes performing a wire boding process. In some embodiments, a plurality of wirings are used to provide electric connection between the semiconductor chip 100 and the substrate 200. One embodiment for the wire bonding process for the arrangement of the semiconductor chip 100 and the substrate 200 shown in the above embodiments are described below. It is understood that additional wirings can be provided to connect the semiconductor chip 100 and the substrate 200. The order of the operations may be interchangeable and at least some of the operations may be performed in a different sequence. In some embodiments, at least two or more operations/processes are performed overlapping in time, or almost simultaneously.

The wire bonding process includes:

(a) forming a plurality of first wirings 411 connecting the first connection pads 221 with the first comb-type conductive layer 310;

(b) forming a plurality of second wirings 412 connecting the second connection pads 222 with the second comb-type conductive layer 320;

(c) forming a plurality of third wirings 413 connecting the third connection pads 231 with the fourth comb-type conductive layer 340;

(d) forming a plurality of fourth wirings 414 connecting the fourth connection pads 232 with the third comb-type conductive layer 330;

(e) forming a plurality of fifth wirings 415 connecting the fifth connection pads 121 with the first comb-type conductive layer 310;

(f) forming a plurality of sixth wirings 416 connecting the sixth connection pads 122 with the second comb-type conductive layer 320;

(g) forming a plurality of seventh wirings 417 connecting the seventh connection pads 131 with the fourth comb-type conductive layer 340; and (h) forming a plurality of eighth wirings 418 connecting the eighth connection pads 132 with the third comb-type conductive layer 330.

In some embodiments, a plurality of signal lines are further formed to connecting the signal pads on the substrate 200 and the signal pads on the semiconductor chip 100. For example, the signal pad 223 is connected to the signal pad 123 via a signal line, and the signal pad 233 is connected to the signal pad 133 via another signal line. In some embodiments, the signal lines may pass through the adhesive layers 302 and 304 respectively to connect the signal pads. That is, a portion of the signal lines may be buried in the adhesive layers 302 and 304.

In some embodiments, the preparation of the semiconductor package further includes encapsulating the semiconductor chip 100, the substrate 200, the first, second, third and fourth comb-type conductive layers 310, 320, 330 and 340, and the first, second, third, fourth, fifth, sixth, seventh and eighth wirings 411-418 by an encapsulating material (not shown in figures). The encapsulating material may include thermosetting epoxy resin. As such, a semiconductor package 10 is formed.

In some embodiments, the first connection pads 221 are connected to a power supply, and the fifth connection pads 121 are power-supply connection pads of the semiconductor chip 100. Through the first wiring 411 and the fifth wiring 415, Vdd (power) signals between the substrate 200 and the semiconductor chip 100 is stably transmitted via the first comb-type conductive layer 310. As a result, an IR drop issue of the Vdd (power) signals is prevented because the first comb-type conductive layer 310 provides electrical connection with a lower electrical resistance.

Similarly, in some embodiments, the fourth connection pads 232 are connected to a power supply, and the eighth connection pads 132 are power-supply connection pads of the semiconductor chip 100. Through the fourth wiring 414 and the eighth wiring 418, Vdd (power) signals between the substrate 200 and the semiconductor chip 100 is stably transmitted via the third comb-type conductive layer 330. As a result, an IR drop issue of the Vdd (power) signals is prevented because the third comb-type conductive layer 330 provides electrical connection with a lower electrical resistance.

In some embodiments, the second connection pads 222 are grounded or connected to a ground voltage supply of a power supply, and the sixth connection pads 122 are grounded voltage connection pads of the semiconductor chip 100. Through the second wiring 412 and sixth wiring 416, ground signals between the substrate 200 and the semiconductor chip 100 is stably transmitted via the second comb-type conductive layer 320. As a result, an IR drop issue of the ground signals is prevented because the second comb-type conductive layer 320 provides electrical connection with a lower electrical resistance.

Similarly, in some embodiments, the third connection pads 231 grounded or connected to a ground voltage supply of a power supply, and the seventh connection pads 131 grounded voltage connection pads of the semiconductor chip 100. Through the third wiring 413 and the seventh wiring 417, ground signals between the substrate 200 and the semiconductor chip 100 is stably transmitted via the fourth comb-type conductive layer 340. As a result, an IR drop issue of the ground signals is prevented because the fourth comb-type conductive layer 340 provides electrical connection with a lower electrical resistance.

Moreover, the first, second, third and fourth comb-type conductive layers 310, 320, 330 and 340 can prevent the semiconductor chip 100 from electronic magnetic interference and electrostatic discharge.

As described above, according to the embodiments of the present disclosure, a semiconductor package and a method of manufacturing thereof are provided. In the embodiments of the present disclosure, a semiconductor chip having two rows of connection pads at two opposite side of a central line is placed on a substrate. Comb-type conductive layers are disposed over the semiconductor chip and at opposite side (i.e., first region and second region) of the two rows of connection pads. The comb-type conductive layers provide electrical connection with a lower electrical resistance, such that the IR drop issue is prevented. Further, power-supply connection pads and grounded voltage connection pads of the semiconductor chip and the substrate are respectively electrically connected to a first and a second comb-type conductive layers over the first region, and these power-supply connection pads and grounded voltage connection pads are adjacent to or the first region. Similarly, other power-supply connection pads and grounded voltage connection pads of the semiconductor chip and the substrate close to or in the second region are respectively electrically connected to a third and a fourth comb-type conductive layers over the second region. Therefore, one comb-type conductive layer can be wire bonding to the connection pads on the right side and the left side at the same time.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A semiconductor package, comprising:
   a substrate, comprising:
      a plurality of first connection pads and a plurality of second connection pads adjacent to a first edge of the substrate; and
      a plurality of third connection pads and a plurality of fourth connection pads adjacent to a second edge of the substrate, wherein the second edge is opposite to the first edge;
   a semiconductor chip disposed on the substrate, wherein the semiconductor chip comprises:
      a first region and a second region respectively adjacent to the first edge and the second edge;
      a plurality of fifth connection pads and a plurality of sixth connection pads disposed in the first region; and
      a plurality of seventh connection pads and a plurality of eighth connection pads disposed in the second region;
   a first comb-type conductive layer and a second comb-type conductive layer disposed over the first region, and a third comb-type conductive layer and a fourth comb-type conductive layer disposed over the second region;
   a plurality of first wirings connecting the first connection pads with the first comb-type conductive layer;
   a plurality of second wirings connecting the second connection pads with the second comb-type conductive layer;
   a plurality of third wirings connecting the third connection pads with the fourth comb-type conductive layer;
   a plurality of fourth wirings connecting the fourth connection pads with the third comb-type conductive layer;
   a plurality of fifth wirings connecting the fifth connection pads with the first comb-type conductive layer;
   a plurality of sixth wirings connecting the sixth connection pads with the second comb-type conductive layer;
   a plurality of seventh wirings connecting the seventh connection pads with the fourth comb-type conductive layer; and
   a plurality of eighth wirings connecting the eighth connection pads with the third comb-type conductive layer.

2. The semiconductor package of claim 1, wherein the first comb-type conductive layer and the second comb-type conductive layer are interdigitated with each other, and the third comb-type conductive layer and the fourth comb-type conductive layer are interdigitated with each other.

3. The semiconductor package of claim 1, wherein each of the first, the second, the third, and the fourth comb-type conductive layers comprises:
   a base portion extending along a first direction; and
   a plurality of protruding portions extending along a second direction from the base portion, wherein the second direction is different from the first direction.

4. The semiconductor package of claim 1, wherein the first connection pads are connected to a power supply, and the fifth connection pads are power-supply connection pads of the semiconductor chip.

5. The semiconductor package of claim 1, wherein the second connection pads are grounded, and the sixth connection pads are ground voltage connection pads of the semiconductor chip.

6. The semiconductor package of claim 1, wherein the third connection pads are grounded, and the seventh connection pads are ground voltage connection pads of the semiconductor chip.

7. The semiconductor package of claim 1, wherein the fourth connection pads are connected to a power supply, and the eighth connection pads are power-supply connection pads of the semiconductor chip.

8. The semiconductor package of claim 1, wherein the first region and the second region are at two opposite sides of a central line, the fifth connection pads and the sixth connection pads are arranged along the central line in the first region, and the seventh connection pads and the eighth connection pads are arranged along the central line in the second region.

9. The semiconductor package of claim 1, further comprising an adhesive layer disposed between the semiconductor chip and the first, the second, the third and the fourth comb-type conductive layers.

10. A method of manufacturing a semiconductor package, comprising:
- providing a substrate comprising a plurality of first connection pads and a plurality of second connection pads adjacent to a first edge of the substrate, and a plurality of third connection pads and a plurality of fourth connection pads adjacent to a second edge of the substrate, wherein the second edge is opposite to the first edge;
- placing a semiconductor chip on the substrate, wherein the semiconductor chip comprises a plurality of fifth connection pads and a plurality of sixth connection pads arranging along a first direction, and a plurality of seventh connection pads and a plurality of eighth connection pads arranging along the first direction and adjacent to the fifth connection pads and sixth connection pads;
- placing a first comb-type conductive layer, a second comb-type conductive layer, a third comb-type conductive layer, and a fourth comb-type conductive layer on the semiconductor chip, wherein the first and the second comb-type conductive layers are close to the first edge, and the third and the fourth comb-type conductive layers are close to the second edge;
- forming a plurality of first wirings connecting the first connection pads with the first comb-type conductive layer;
- forming a plurality of second wirings connecting the second connection pads with the second comb-type conductive layer;
- forming a plurality of third wirings connecting the third connection pads with the fourth comb-type conductive layer;
- forming a plurality of fourth wirings connecting the fourth connection pads with the third comb-type conductive layer;
- forming a plurality of fifth wirings connecting the fifth connection pads with the first comb-type conductive layer;
- forming a plurality of sixth wirings connecting the sixth connection pads with the second comb-type conductive layer;
- forming a plurality of seventh wirings connecting the seventh connection pads with the fourth comb-type conductive layer; and
- forming a plurality of eighth wirings connecting the eighth connection pads with the third comb-type conductive layer.

11. The method of claim 10, wherein the first comb-type conductive layer are interdigitated with the second comb-type conductive layer, and the third comb-type conductive layer are interdigitated with the fourth comb-type conductive layer.

12. The method of claim 10, wherein the first connection pads are connected to a power supply, and the fifth connection pads are power-supply connection pads of the semiconductor chip; and
- wherein the second connection pads are grounded, and the sixth connection pads are grounded voltage connection pads of the semiconductor chip.

13. The method of claim 10, wherein the third connection pads are grounded, and the seventh connection pads are grounded voltage connection pads of the semiconductor chip; and
- wherein the fourth connection pads are connected to a power supply, and the eighth connection pads are power-supply connection pads of the semiconductor chip.

14. The method of claim 10, wherein the semiconductor chip has a first region and a second region adjacent to the first region, the fifth connection pads and the sixth connection pads are disposed in the first region, and the seventh connection pads and the eighth connection pads are disposed in the second region.

15. The method of claim 10, wherein the first, the second, the third, and the fourth comb-type conductive layers are attached to the semiconductor chip via an adhesive layer.

* * * * *